(12) United States Patent
Ma

(10) Patent No.: US 12,733,312 B2
(45) Date of Patent: Sep. 8, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Liang Ma, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 407 days.

(21) Appl. No.: 18/549,929

(22) PCT Filed: May 12, 2023

(86) PCT No.: PCT/CN2023/094030
§ 371 (c)(1),
(2) Date: Sep. 11, 2023

(87) PCT Pub. No.: WO2024/198056
PCT Pub. Date: Oct. 3, 2024

(65) Prior Publication Data

US 2025/0089412 A1 Mar. 13, 2025

(30) Foreign Application Priority Data

Mar. 29, 2023 (CN) ........................ 202310344193.1

(51) Int. Cl.

| | |
|---|---|
| ***H10H 20/853*** | (2025.01) |
| ***H10H 20/857*** | (2025.01) |
| ***H10W 90/00*** | (2026.01) |

(52) U.S. Cl.
CPC ........ *H10H 20/853* (2025.01); *H10H 20/857* (2025.01); *H10W 90/00* (2026.01)

(58) Field of Classification Search
CPC .. H10H 20/853; H10H 20/857; H10H 20/852; H10K 59/783; H10K 59/40
See application file for complete search history.

(56) References Cited

U.S. PATENT DOCUMENTS

2019/0198587 A1* 6/2019 Park ........................ H10K 50/11
2020/0006701 A1* 1/2020 Lee ........................ H10K 59/12

FOREIGN PATENT DOCUMENTS

CN 114141836 A 3/2022

OTHER PUBLICATIONS

International Search Report in International application No. PCT/CN2023/094030,mailed on Dec. 26, 2023.
Written Opinion of the International Search Authority in International application No. PCT/CN2023/094030,mailed on Dec. 26, 2023.

* cited by examiner

*Primary Examiner* — Monica D Harrison
*Assistant Examiner* — Jacob T Nelson
(74) *Attorney, Agent, or Firm* — PV IP PC; Christopher S. Ruprecht; Wei Te Chung

(57) ABSTRACT

A display panel includes a substrate, an inorganic insulating layer, an organic insulating layer, a light emitting layer and an encapsulation layer, where the organic insulating layer includes an organic insulating portion, and the encapsulation layer covers at least part of the organic insulating portion and does not extend to a first wiring hole of the organic insulating layer.

20 Claims, 2 Drawing Sheets

DISPLAY PANEL AND DISPLAY DEVICE

CROSS-REFERENCE TO RELATED APPLICATIONS

This application is a national stage of International Application No. PCT/CN2023/094030, filed on May 12, 2023, which claims priority to Chinese Patent Application No. 202310344193.1, filed on Mar. 29, 2023. Both of the aforementioned applications are hereby incorporated by reference in their entireties.

TECHNICAL FIELD

The present invention relates to the field of design and manufacturing technologies for display panels, and in particular, to a display panel and a display device.

BACKGROUND

With the continuous development of the manufacturing technology of display panels, people have put forward higher requirements for the performance of display panels and devices.

In the process of manufacturing display panels, a plurality of functional layers need to be formed, which correspond to different manufacturing processes, such as photomask and etching processes. Encapsulation for the functional layers is performed after the functional layers are formed, for example, forming an encapsulation layer to effectively prevent external water vapor from entering into the display panel and prevent the display panel from being damaged. A plurality of metal wirings, such as metal touch wires, are required in the display panel. The metal touch wires are usually disposed on the encapsulation layer. In the prior art, the encapsulation layer usually has a large tilt angle at the position between the display area and the bonding area. The large tilt angle causes the encapsulation layer to transition steeply in this area. When performing etching process to form metal wirings on the steep encapsulation layer, the large etching amount will make the roughness of the surface of the layers larger, and cause metal residues to remain at the position corresponding to the tilt angle, and the flatness of the formed layer is poor, which leads to short circuit problems between different metal wirings, causing the display panel to fail to work normally, reducing the reliability and overall performance of the display panel.

Therefore, solutions to the problems in the prior art are needed.

SUMMARY OF THE INVENTION

In summary, in the prior art, during the process of manufacturing a display panel, a steep tilt angle exists in the encapsulation layer in the display panel. When forming and etching the metal wirings at the tilt angle, there will be metal residues, which leads to internal short circuits in the display panel, thereby reducing the reliability and overall performance of the display panel.

To solve the above problems, embodiments of the present invention provide a display panel and a display device to effectively improve the problem in the prior art that the display panel cannot work normally due to the existence of a steep tilt angle inside the encapsulation layer of the display panel, which further leads to residual etched metal.

To solve the above technical problems, the present application provides a display panel comprising a display area and a non-display area disposed on a side of the display area, wherein the display panel comprises:

a substrate;

an inorganic insulating layer disposed on a surface of the substrate, the inorganic insulating layer comprising a first groove disposed in the non-display area;

an organic insulating layer disposed on a surface of the inorganic insulating layer away from the substrate, the organic insulating layer comprising a dam disposed between the first groove and the display area, an organic insulating portion disposed on a side of the dam away from the display area, a second groove disposed between the dam and the organic insulating portion, and a first wiring hole disposed between the organic insulating portion and the first groove;

a light emitting layer disposed on a surface of the organic insulating layer away from the substrate and correspondingly disposed in the display area;

an encapsulation layer disposed on a surface of the light emitting layer away from the substrate, the encapsulation layer being disposed in the display area and extending to the non-display area, the encapsulation layer covering at least part of the organic insulating portion and not extending to the first wiring hole, a thickness of the encapsulation layer corresponding to the second groove being greater than a thickness of the encapsulation layer corresponding to the organic insulating portion;

wherein the encapsulation layer comprises a first encapsulation portion and a second encapsulation portion, the first encapsulation portion is disposed on a side close to the display area, the second encapsulation portion is connected to the first encapsulation portion, and a thickness of the first encapsulation portion is greater than or equal to a thickness of the second encapsulation portion.

According to an embodiment of the present application, the organic insulating portion comprises a first side surface close to the display area and a top surface away from the substrate, the first side surface being connected to the top surface;

the thickness of the encapsulation layer corresponding to the second groove is greater than the thickness of the encapsulation layer corresponding to the top surface.

According to an embodiment of the present application, the encapsulation layer comprises a first etched surface disposed corresponding to the first side surface, a thickness of a portion of the encapsulation layer located on a side of the first etched surface close to the display area is greater than a thickness of a portion of the encapsulation layer located on a side of the first etched surface away from the display area.

According to an embodiment of the present application, a first angle between the top surface and a substrate on a side of the top surface away from the display area is smaller than 90 degrees;

a second angle between the first etched surface and a substrate on a side of the first etched surface close to the display area is smaller than 90 degrees.

According to an embodiment of the present application, the second angle is smaller than or equal to 60 degrees.

According to an embodiment of the present application, further comprising:

a touch layer disposed on a surface of the encapsulation layer away from the substrate, wherein the touch layer comprises:

an insulating sub-layer disposed on a surface of the encapsulation layer away from the substrate, the insulating sub-layer covering the display area and extending to the non-display area, a boundary of the insulating sub-layer in the non-display area not exceeding the first etched surface;

a touch metal sub-layer disposed on a surface of the insulating sub-layer away from the substrate, the touch metal sub-layer comprising a touch lead wire disposed from the display area to the non-display area, and passing through the first etched surface and extending to the first wiring hole.

According to an embodiment of the present application, the organic insulating layer comprises:

a first organic insulating sub-layer disposed on a surface of the inorganic insulating layer away from the substrate, the first organic insulating sub-layer comprising a first organic insulating sub-portion disposed in the second groove away from the display area, the first organic insulating sub-portion filling the first groove;

a second organic insulating sub-layer disposed on a surface of the first organic insulating sub-layer away from the substrate, the second organic insulating sub-layer comprising a second organic insulating sub-portion disposed in the second groove away from the display area, the second organic insulating sub-portion disposed on a surface of the first organic insulating sub-portion away from the substrate;

wherein the first wiring hole penetrates through the second organic insulating sub-portion;

or, the first wiring hole penetrates through both the second organic insulating sub-portion and the first organic insulating sub-portion.

According to an embodiment of the present application, the first organic insulating sub-portion comprises a first sub side surface on a side close to the display area;

the second organic insulating sub-portion comprises a second sub side surface on a side close to the display area;

the first etched surface is disposed corresponding to the first sub side surface or the second sub side surface.

According to an embodiment of the present application, a surface roughness of the top surface between the encapsulation layer and the first wiring hole is greater than a surface roughness of the top surface covered by the encapsulation layer.

According to the second aspect of the embodiments of the present application, the present application also provides a display panel comprising a display area and a non-display area disposed on a side of the display area, wherein the display panel comprises:

a substrate;

an inorganic insulating layer disposed on a surface of the substrate, the inorganic insulating layer comprising a first groove disposed in the non-display area;

an organic insulating layer disposed on a surface of the inorganic insulating layer away from the substrate, the organic insulating layer comprising a dam disposed between the first groove and the display area, an organic insulating portion disposed on a side of the dam away from the display area, a second groove disposed between the dam and the organic insulating portion, and a first wiring hole disposed between the organic insulating portion and the first groove;

a light emitting layer disposed on a surface of the organic insulating layer away from the substrate and correspondingly disposed in the display area;

an encapsulation layer disposed on a surface of the light emitting layer away from the substrate, the encapsulation layer being disposed in the display area and extending to the non-display area, the encapsulation layer covering at least part of the organic insulating portion and not extending to the first wiring hole, a thickness of the encapsulation layer corresponding to the second groove being greater than a thickness of the encapsulation layer corresponding to the organic insulating portion.

According to an embodiment of the present application, the organic insulating portion comprises a first side surface close to the display area side and a top surface away from the substrate, the first side surface being connected to the top surface;

the thickness of the encapsulation layer corresponding to the second groove is greater than the thickness of the encapsulation layer corresponding to the top surface.

According to an embodiment of the present application, the encapsulation layer comprises a first etched surface disposed corresponding to the first side surface, a thickness of a portion of the encapsulation layer located on a side of the first etched surface close to the display area is greater than a thickness of a portion of the encapsulation layer located on a side of the first etched surface away from the display area.

According to an embodiment of the present application, a first angle between the top surface and a substrate on a side of the top surface away from the display area is smaller than 90 degrees;

a second angle between the first etched surface and a substrate on a side of the first etched surface close to the display area is smaller than 90 degrees.

According to an embodiment of the present application, the second angle is smaller than or equal to 60 degrees.

According to an embodiment of the present application, further comprising:

a touch layer disposed on a surface of the encapsulation layer away from the substrate, wherein the touch layer comprises:

an insulating sub-layer disposed on a surface of the encapsulation layer away from the substrate, the insulating sub-layer covering the display area and extending to the non-display area, a boundary of the insulating sub-layer in the non-display area not exceeding the first etched surface;

a touch metal sub-layer disposed on a surface of the insulating sub-layer away from the substrate, the touch metal sub-layer comprising a touch lead wire disposed from the display area to the non-display area, and passing through the first etched surface and extending to the first wiring hole.

According to an embodiment of the present application, the organic insulating layer comprises:

a first organic insulating sub-layer disposed on a surface of the inorganic insulating layer away from the substrate, the first organic insulating sub-layer comprising a first organic insulating sub-portion disposed in the second groove away from the display area, the first organic insulating sub-portion filling the first groove;

a second organic insulating sub-layer disposed on a surface of the first organic insulating sub-layer away from the substrate, the second organic insulating sub-layer comprising a second organic insulating sub-portion disposed in the second groove away from the display area, the second organic insulating sub-portion disposed on a surface of the first organic insulating sub-portion away from the substrate;

wherein the first wiring hole penetrates through the second organic insulating sub-portion;

or, the first wiring hole penetrates through both the second organic insulating sub-portion and the first organic insulating sub-portion.

According to an embodiment of the present application, the first organic insulating sub-portion comprises a first sub side surface on a side close to the display area;

the second organic insulating sub-portion comprises a second sub side surface on a side close to the display area;

the first etched surface is disposed corresponding to the first sub side surface or the second sub side surface.

According to an embodiment of the present application, a surface roughness of the top surface between the encapsulation layer and the first wiring hole is greater than a surface roughness of the top surface covered by the encapsulation layer.

According to an embodiment of the present application, the encapsulation layer covers the second groove and directly contacts a surface of the inorganic insulating layer away from the substrate at the second groove.

According to the third aspect of the embodiments of the present application, the present application also provides a display device comprising a display panel provided in the embodiments of the present application.

Advantageous Effects

In summary, the embodiments of the present invention include following advantageous effects:

A display panel and a display device is provided in the embodiments of the present invention, the display panel includes a display area and a non-display area disposed on a side of the display area, the display panel further includes a substrate, an inorganic insulating layer, an organic insulating layer, a light emitting layer, and an encapsulation layer, wherein the organic insulating layer includes an organic insulating portion, the encapsulation layer covers at least part of the organic insulating portion and does not extend to the first wiring hole, the encapsulation layer also covers the second groove of the organic insulating layer and directly contacts the surface of the inorganic insulating layer, and the thickness of the portion of the encapsulation layer located at the second groove is greater than the thickness of the portion of the encapsulation layer located at the organic insulating portion. In the embodiments of the present application, different thicknesses of the encapsulation layer are formed with a plurality of different etching processes, and the etched groove of the encapsulation layer is formed on the side surface or the top surface of the film layers of the display panel, thereby effectively improving the etching effect of the encapsulation layer in the etching process, ensuring the sealing effect of the encapsulation layer and effectively improving the reliability and overall performance of the display panel.

DETAILED DESCRIPTION OF THE EMBODIMENTS

The description of the following embodiments refers to the accompanying drawings, which illustrate specific embodiments that can be implemented in the present application.

With the continuous development of display panel and device manufacturing technology, higher requirements have been put forward for the performance and display effect of display devices.

Figure 1:
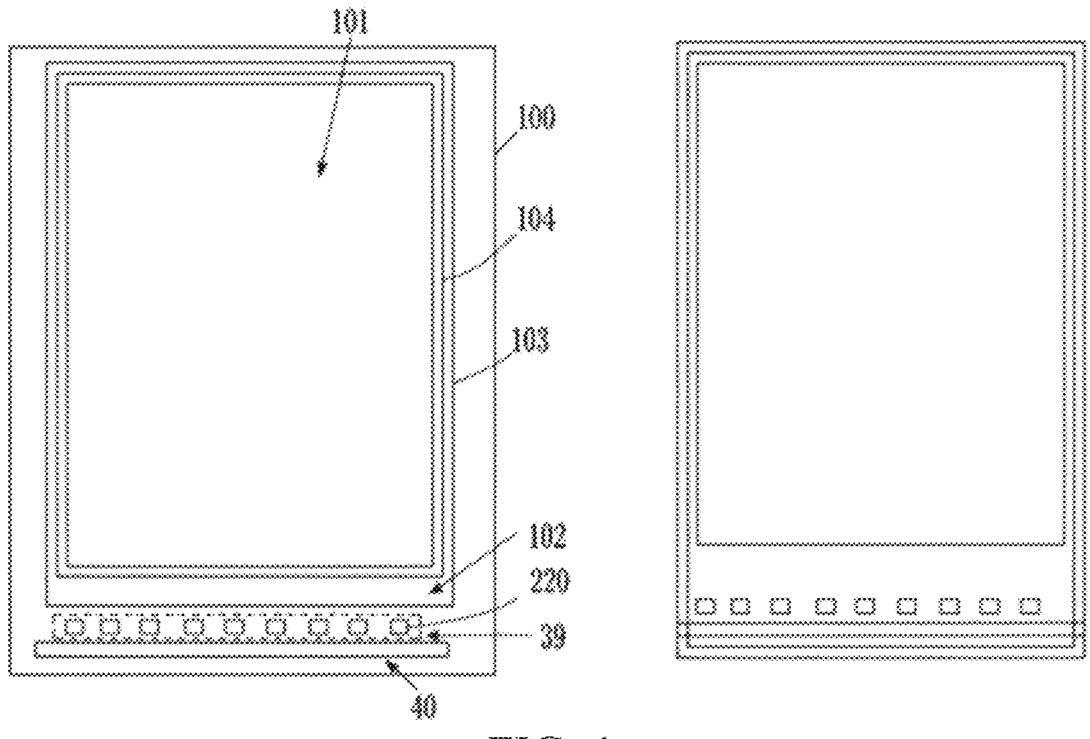
FIG. 1 is a schematic diagram of a planar structure of a display panel provided in the prior art.

Compared with conventional display panels, as shown in FIG. 1, FIG. 1 is a schematic diagram of a planar structure of a display panel provided in the prior art. Functional layers of the display panel need to be encapsulated after the functional layers of the display panel are formed. The display panel includes a display area 101 and a non-display area 102. The non-display area 102 can be a bonding area at the edge of the display panel. In the embodiments of the present application, a wiring area 39 and a bending area 40 are provided in the non-display area. A plurality of first wiring holes are provided in the wiring area 39, and the wiring area 39 is disposed at a side close to the display area, and the bending area 40 is disposed at a side close to the edge of the display panel. In addition, an encapsulation layer is also provided in the display panel. Specifically, the encapsulation layer is disposed at least in the display area and extends to the non-display area, such as extending to the bending area in the non-display area. As shown in FIG. 1, the encapsulation layer includes an inner boundary 104 and an outer boundary 103. An encapsulation area with a certain width is formed between the inner boundary 104 of the encapsulation layer and the outer boundary 103 of the encapsulation layer to effectively encapsulate the display panel as the encapsulation area constitutes an effective encapsulation area.

In addition, in the wiring area 39, a metal layer disposed on the encapsulation layer is electrically connected to the array substrate through the first wiring hole. However, in the prior art, during the etching process of the encapsulation layer, due to the large etching amount and large tilt angle at the inner and outer boundaries of the encapsulation layer, metal residue may occur. The occurred metal residue can lead to short circuit between other metals in this region, thus reducing the reliability and overall performance of the display panel.

The embodiments of the present application provide a display panel and a display device to effectively improve the problem of metal residue occurring in the etched region during the etching process of the encapsulation layer of the display panel due to the large sloped angle formed.

Figure 2A:
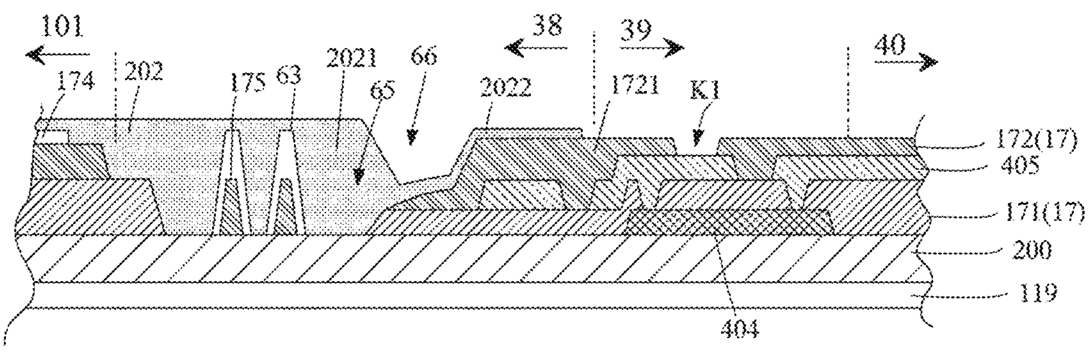
FIG. 2A is a schematic diagram of a film layer structure of a display panel provided in the embodiments of the present application.

As shown in FIG. 2A, FIG. 2A is a schematic diagram of a film layer structure of a display panel provided in the embodiments of the present application. FIG. 2A only shows a film layer structure in a partial area of the display panel. Specifically, FIG. 2A shows a part of the display area 101, a wiring area 39, and a part of the bending area 40 of the display panel. The display panel includes a substrate 119, an inorganic insulating layer 200, an organic insulating layer 17, a first signal wire layer 404, a dam 63, a second signal wire layer 405, a light-emitting layer 174, and an encapsulation layer 202.

Specifically, the substrate 119 is taken as a conventional array substrate 119 for illustration. The inorganic insulating layer 200 is disposed on the array substrate 119, and the first signal wiring layer 404 is disposed on the inorganic insulating layer 200. In addition, in the following embodiments, the organic insulating layer 17 is taken as a first planarization layer 171 and a second planarization layer 172 for illustration.

The first planarization layer 171 is disposed on the inorganic insulating layer 200 and covers the first signal wiring layer 404. In addition, the second signal wiring 405 is disposed on the first planarization layer 171, and the second planarization layer 172 is disposed on the first planarization layer 171 and covers the second signal wiring 405.

In the embodiments of the present application, the inorganic insulating layer 200, the first planarization layer 171, and the second planarization layer 172 are disposed in the display area and extend to the non-display area. In addition, in the non-display area, the inorganic insulating layer 200 further comprises a first groove, the structure of which is not shown in FIG. 2A. Specifically, the first groove is disposed in the bending area 40 of the non-display area 102. By providing the first groove in the bending area 40, part of the material in the inorganic insulating layer is removed, which can reduce the stress when the display panel is bent and improve the bending performance of the display panel. In addition, different signal lines can be bridged through the first groove.

In addition, In addition, the first signal wiring layer 404 in the non-display area of the array substrate and the source-drain metal layer in the display area of the array substrate are made of the same metal layer, for example, when preparing the first source-drain metal layer of the array substrate, the first source-drain metal layer located in the non-display area is the first signal wiring layer 404; when preparing the second source-drain metal layer of the array substrate, the second source-drain metal layer located in the non-display area is the second signal wiring layer 405. Through the first signal wiring layer 404 and the second signal wiring layer 405, transmission of control signals can be realized to ensure normal operation of the display panel.

In the embodiments of the present application, in the non-display area, the second signal wiring layer 405 is mainly disposed in the wiring area 39, and transmits signals to wirings of different layers in the wiring area 39. The second signal wiring layer 405 is electrically connected to the first signal wiring layer 404, for example, electrically connected through via holes.

Furthermore, as shown in FIG. 2A, the second planarization layer 172 is disposed in the display area and extends to the non-display area. In addition, the second planarization layer 172 includes a dam 63 disposed between the first groove and the display area, and an organic insulating portion 1721 disposed on the side of the dam 63 away from the display area.

Furthermore, a second groove 65 is disposed between the display area and the organic insulating portion 1721, and a first wiring hole K1 is disposed between the organic insulating portion 1721 and the first groove. In the embodiments of the present application, the first wiring hole K1 is disposed in the wiring area 39, so as to achieve electrical connection between different signal lines.

In the embodiments of the present application, the light-emitting layer 174 is disposed in the display area and on a surface of the second planarization layer 172 away from the substrate. In addition, forming a pixel definition layer 175 correspondingly when forming the light-emitting layer 174.

Furthermore, the encapsulation layer 202 is disposed on a surface of the light-emitting layer 174 away from the substrate, and the encapsulation layer 202 is disposed in the display area and extends to the non-display area. Since a plurality of dams 63 are formed in the non-display area, the dams 63 can further increase the contact area between the encapsulation layer 202 and other film layers, thereby improving the encapsulation effect. In embodiments of the present application, the area corresponding to the dam 63 is an effective encapsulation area 38 of the display panel. In the effective encapsulation area 38, the encapsulation layer 202 can achieve a better sealing effect on the display panel and ensure the performance of the display panel.

In embodiments of the present application, the encapsulation layer 202 covers at least part of the organic insulating portion 1721, and the encapsulation layer 202 does not extend to the first wiring hole K1. In addition, the encapsulation layer 202 covers the second groove 65, and the encapsulation layer 202 directly contacts and seals a surface of the inorganic insulating layer 200 away from the substrate 119 in the region of the second groove 65. The thickness of a portion of the encapsulation layer 202 located at the second groove 65 is greater than the thickness of a portion of the encapsulation layer 202 located at the organic insulating portion 1721.

The encapsulation layer 202 having different thicknesses at different positions can be formed through a plurality of etching processes. In the following embodiments, the encapsulation layer formed through two etching processes is taken as an example for illustration. In the first etching process, the etching depth for the encapsulation layer is greater than the etching depth for the encapsulation layer in the second etching process. In the embodiments of the present application, when etching the encapsulation layer 202, the above two etching processes are performed on the encapsulation layer 202 in the second groove 65 on a side of the dam 63 away from the display area, the etching amounts corresponding to the two etching processes are different (the etching depth in the second etching process is smaller). Under different etching amounts, both the roughness of the formed film layer and the etched tilt angle are different. By controlling the etching amount, the roughness of the film layer after etching can be improved, and the flatness of the etched surface and the overall performance of the display panel can be ensured.

Figure 2B:
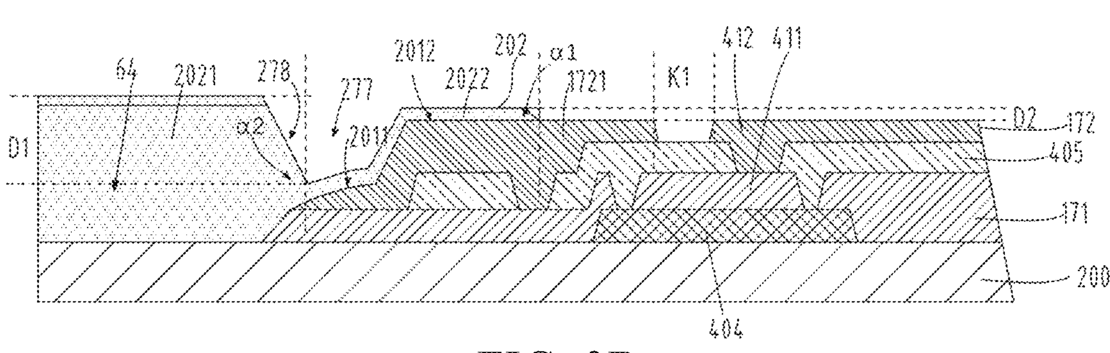
FIG. 2B is a schematic diagram of a film layer structure of another display panel provided in the embodiments of the present application.

As shown in FIG. 2B, FIG. 2B is a schematic diagram of a film layer structure of another display panel provided in the embodiments of the present application. In combination with the structures shown in FIGS. 1-2A, in the embodiments of the present application, since the second planarization layer 172 is directly disposed on other film layers, the second planarization layer 172 is provided with a certain height. In addition, the organic insulating portion 1721 includes a first side surface 2011 close to the display area and a top surface 2012 away from the array substrate. In the embodiments of the present application, the first side surface 2011 is a curved surface with a certain curvature. In addition, the top surface 2012 is a horizontal plane or a surface with other structures, and the cross-sectional shape of the surface is as shown in FIG. 2B.

In embodiments of the present application, the encapsulation layer 202 has different thicknesses at different positions between the display area and the non-display area. The encapsulation layer 202 with different thicknesses is formed through an etching process. In embodiments of the present application, the film thickness of the encapsulation layer 202 at the second groove on the side close to the display area is greater than the film thickness of the encapsulation layer 202 at the top surface 2012 of the organic insulating portion 1721, that is, the thickness of the encapsulation layer 202 on the side close to the display area is larger. Therefore, it can ensure the encapsulation effect of the encapsulation layer 202 on the film layer in the display area of the display panel, and can effectively prevent external air and other substances from entering the display panel.

As shown in FIG. 2B, the encapsulation layer 202 includes a first encapsulation portion 2021 and a second encapsulation portion 2022. The first encapsulation portion 2021 is disposed on the side close to the display area, and the second encapsulation portion 2022 is connected to the first encapsulation portion 2021 and covers at least a portion of the organic insulating portion 1721. The second encapsulation portion 2022 is disposed on the side away from the display area.

In the embodiments of the present application, the thickness of the first encapsulation portion 2021 is greater than or equal to the thickness of the second encapsulation portion 2022. In addition, the width of the encapsulation area of the first encapsulation portion 2021 is greater than the width of the encapsulation area of the second encapsulation portion 2022, thereby ensuring the encapsulation effect of the encapsulation layer.

Furthermore, an etching groove 277 is also provided between the first encapsulation portion 2021 and the second encapsulation portion 2022. The etching groove 277 is disposed above the organic insulating portion 1721. The first encapsulation portion 2021 is connected to the second encapsulation portion 2022 through the etching groove 277. That is, the region where the etching groove 277 is located is a transition region between the first encapsulation portion 2021 and the second encapsulation portion 2022. In the embodiments of the present application, by providing the etching groove 277, the height difference between the first encapsulation portion 2021 and the second encapsulation portion 2022 can be effectively reduced, thereby effectively reducing the corresponding tilt angle and improving the etching effect, and making the etched surface smoother to prevent metal residue during etching processes.

Specifically, in the etching groove 277, the thickness of a portion of the encapsulation layer on a side of the first etched surface 278 close to the display area is greater than the thickness of a portion of the encapsulation layer on a side of the first etched surface 278 away from the display area.

In addition, in the embodiments of the present application, the etching depth of the etching groove 277 is greater than or equal to the thickness of the second encapsulation portion 2022, the second encapsulation portion 2022 is the encapsulation layer located outside the etching groove 277. From the edge of the display area toward the side away from the display area, the thickness of the second encapsulation portion 2022 gradually decreases, thereby enabling the second encapsulation portion 2022 to form a gentle transition, so as to effectively reduce the thickness of the film layer of the display panel.

Furthermore, in the embodiments of the present application, the height of the first encapsulation portion 2021 is greater than the height of the second planarization layer 172, and a certain height difference is formed between the first encapsulation portion 2021 and the second planarization layer 172, which can effectively prevent external water vapor from entering the film layers of the display panel, thereby improving the encapsulation effect of the display panel. In the embodiments of the present application, the edge of the second encapsulation portion 2022 on a side away from the display area is disposed at least on the first side surface 2011 or the top surface 2012. This can lift height of the edge of the second encapsulation portion, thereby effectively improving the sealing effect.

In the embodiments of the present application, relative to the upper surface of the first encapsulation portion 2021, the etching depth of the etching groove 277 is D1, and relative to the edge of the second encapsulation portion 2022, the etching depth of the etching groove 277 is D2. The value of etching depth D1 is greater than the value of etching depth D2. Preferably, the etching depth D1>1 um, and the total etching depth of the etching depth D1 and the etching depth D2 is less than 2.4 um. Alternatively, the total etching depth of the etching depth D1 and the etching depth D2 is 2 um, which can ensure that the encapsulation layer after etching has a smaller tilt angle, effectively reducing the height difference between the first encapsulation portion 2021 and the second encapsulation portion 2022, and preventing metal residues during the etching processes.

Furthermore, in the embodiments of the present application, a first angle $\alpha$1 between the top surface 2012 and a substrate on a side of the top surface 2012 away from the display area is smaller than 90 degrees. In addition, a second angle $\alpha$2 between the first etched surface 278 and a substrate on a side of the first etched surface 278 close to the display area is smaller than 90 degrees. By defining the above first angle $\alpha$1 and the above second angle $\alpha$2, the sealing effect can be ensured.

In the embodiments of the present application, the second angle $\alpha$2 is less than or equal to 60°. Alternatively, the angle $\alpha$ is 50°, 40°, or 30°. Through the etching groove 277, the tilt of the encapsulation layer can be effectively reduced, thereby preventing metal residues during etching processes.

In the embodiments of the present application, the number of the first wiring holes K1 is plural, and a plurality of wiring holes 220 are spaced apart and disposed in the edge area close to the display panel. The wiring hole 220 penetrates through the second planarization layer 172.

Furthermore, the orthographic projection of the second encapsulation portion 2022 on the substrate overlaps with the orthographic projection of the second signal wire layer 405 on the substrate. In the wiring area 39, the second signal wire layer 405 is electrically connected to the first signal wire layer 404 through via holes, and the organic insulating portion 1721 covers at least part of the second signal wire layer 405.

Furthermore, in the embodiments of the present application, the surface roughness of the top surface 2012 of the organic insulating portion 1721 between the encapsulation layer 202 and the first wiring hole K1 is greater than the surface roughness of the top surface of the organic insulating portion 1721 covered by the encapsulation layer 202.

Furthermore, the encapsulation layer 202 covers the second groove 65 and directly contacts and closely attaches to a surface of the inorganic insulating layer 200 in the second groove 65 away from the substrate, thereby effectively encapsulating the film layers in the display area and blocking external water vapor, etc. from entering the display panel.

Optionally, as shown in FIG. 2B, in the embodiments of the present application, the organic insulating layer 17 includes a first planarization layer 171 and a second planarization layer 172. Further, the organic insulating layer 17 is also provided with a first organic insulating sublayer and a second organic insulating sublayer on a side away from the display area.

Specifically, the first organic insulating sublayer is disposed on a surface of the inorganic insulating layer 200 away from the substrate. The first organic insulating sublayer includes a first organic insulating sub-portion 411 disposed on the side of the second groove away from the display area, and the first organic insulating sub-portion fills the first groove. The second organic insulating sublayer is disposed on a surface of the first organic insulating sublayer away from the substrate. The second organic insulating sublayer includes a second organic insulating sub-portion disposed on the side of the second groove away from the display area, and the second organic insulating sub-portion is disposed on a surface of the first organic insulating sub-portion away from the substrate.

In addition, the first wiring hole K1 penetrates through the second organic insulating sub-portion 412 and exposes the second signal wire 405.

Alternatively, the first wiring hole K1 penetrates through both the first organic insulating sub-portion 411 and the second organic insulating sub-portion 412, and directly exposes the first signal wire 404. The film layer structure on the right side of the first wiring hole K1 shown in FIG. 2B is only a partial film layer structure.

Correspondingly, as shown in FIG. 2A, the organic insulating portion 1721 includes a first organic insulating sublayer and a second organic insulating sublayer. The first organic insulating sub-portion includes a first sub-side surface close to the display area side, and the second organic insulating sub-portion includes a second sub-side surface close to the display area side. The first etched surface 278 of the encapsulation layer corresponds to the first sub-side surface or the second sub-side surface. For example, the first etched surface 278 of the encapsulation layer corresponds to the first side surface 2011.

Figure 3:
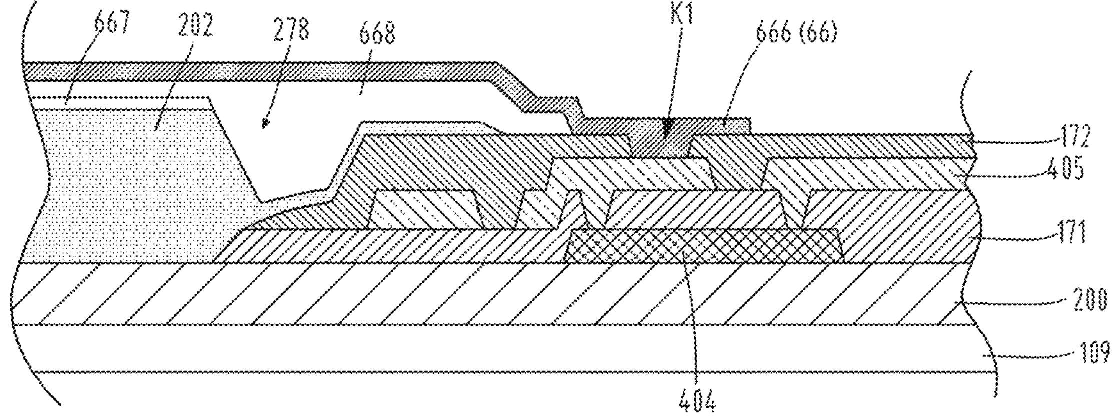
FIG. 3 is a schematic diagram of a film layer structure of another display panel provided in the embodiments of the present application.

As shown in FIG. 3, FIG. 3 is a schematic diagram of a film layer structure of another display panel provided in the embodiments of the present application. In embodiments of the present application, in addition to the structure shown in FIG. 1, the display panel further includes a touch layer 66. The touch layer 66 includes an insulating sub-layer 667, an organic sub-layer 668, and a touch metal sub-layer 666. The insulating sub-layer 667 is disposed on a surface of the encapsulation layer 202 away from the substrate, the organic sub-layer 668 is disposed on the insulating sub-layer 667, and the insulating sub-layer covers the display area and extends to the non-display area. The boundary of the insulating sub-layer 667 in the non-display area does not exceed the first etched surface 278. Further, the touch metal sub-layer 666 is disposed on the organic sub-layer 668, and the touch metal sub-layer 666 is disposed in the display area and extends to the non-display area, while the touch metal sub-layer includes a touch wire. The touch wire passes through the first etched surface 278 along the direction from the display area towards the non-display area and extends to the first wiring hole K1, and is electrically connected to the second signal wire layer 405 to achieve transmission of touch signals in the display panel.

Furthermore, embodiments of the present application further provide a display device including the display panel according to embodiments of the present application, where the encapsulation layer in the display panel is structured according to embodiments of the present application. By setting the etched groove on the side or top surface of the organic insulating portion, the etching effect of the encapsulation layer can be effectively improved during the preparation process of the display panel, and the surface roughness after etching can be improved, thereby enhancing the reliability and overall performance of the display panel.

In the embodiments of the present application, the flexible display device can be any product or component having a display function or touch operation function such as a foldable mobile phone, computer, electronic paper, display, etc. The specific type is not specifically limited.

In summary, the above describes a display panel 100 and a display device provided in the embodiments of the present invention in detail. Specific examples are used to explain the principles and embodiments of the present application. The above embodiments are only used to help understand the technical solutions and core ideas of the present application. Although the present invention discloses the preferred embodiments as above, the above preferred embodiments are not intended to limit the present application. Changes and modifications made by ordinary skilled in the art shall fall within the scope of protection of the present application defined by the claims.

What is claimed is:

1. A display panel comprising a display area, a wiring area, and an effective encapsulation area located between the display area and the wiring area, wherein the display panel comprises:

a substrate;

an inorganic insulating layer disposed on a surface of the substrate;

an organic insulating layer disposed on a surface of the inorganic insulating layer away from the substrate, the organic insulating layer comprising a dam disposed in the effective encapsulation area, an organic insulating portion disposed on a side of the dam away from the display area, a groove disposed between the dam and the organic insulating portion, and a first wiring hole disposed in the wiring area;

a light emitting layer disposed on a surface of the organic insulating layer away from the substrate and correspondingly disposed in the display area;

an encapsulation layer disposed on a surface of the light emitting layer away from the substrate, the encapsulation layer being disposed in the display area and extending to the non-display area, the encapsulation layer covering at least part of the organic insulating portion and not extending to the first wiring hole, a thickness of the encapsulation layer corresponding to the groove being greater than a thickness of the encapsulation layer corresponding to the organic insulating portion;

wherein the encapsulation layer comprises a first encapsulation portion and a second encapsulation portion, the first encapsulation portion is disposed on a side close to the display area, the second encapsulation portion is connected to the first encapsulation portion, and a thickness of the first encapsulation portion is greater than or equal to a thickness of the second encapsulation portion.

2. The display panel according to claim 1, wherein the organic insulating portion comprises a first side surface close to the display area and a top surface away from the substrate, the first side surface being connected to the top surface;

the thickness of the encapsulation layer corresponding to the groove is greater than the thickness of the encapsulation layer corresponding to the top surface.

3. The display panel according to claim 2, wherein the encapsulation layer comprises a first etched surface disposed corresponding to the first side surface, a thickness of a portion of the encapsulation layer located on a side of the first etched surface close to the display area is greater than a thickness of a portion of the encapsulation layer located on a side of the first etched surface away from the display area.

4. The display panel according to claim 3, wherein a first angle between the top surface and the substrate on a side of the top surface away from the display area is smaller than 90 degrees;

a second angle between the first etched surface and the substrate on a side of the first etched surface close to the display area is smaller than 90 degrees.

5. The display panel according to claim 4, wherein the second angle is smaller than or equal to 60 degrees.

6. The display panel according to claim 3, further comprising:

a touch layer disposed on a surface of the encapsulation layer away from the substrate, wherein the touch layer comprises:

an insulating sub-layer disposed on a surface of the encapsulation layer away from the substrate, the insulating sub-layer covering the display area and extending to the non-display area, a boundary of the insulating sub-layer in the non-display area not exceeding the first etched surface;

a touch metal sub-layer disposed on a surface of the insulating sub-layer away from the substrate, the touch metal sub-layer comprising a touch lead wire disposed from the display area to the non-display area, and passing through the first etched surface and extending to the first wiring hole.

7. The display panel according to claim 3, wherein the organic insulating layer comprises:

a first organic insulating sub-layer disposed on a surface of the inorganic insulating layer away from the substrate, the first organic insulating sub-layer comprising a first organic insulating sub-portion disposed in the groove away from the display area;

a second organic insulating sub-layer disposed on a surface of the first organic insulating sub-layer away from the substrate, the second organic insulating sub-layer comprising a second organic insulating sub-portion disposed in the groove away from the display area, the second organic insulating sub-portion disposed on a surface of the first organic insulating sub-portion away from the substrate;

wherein the first wiring hole penetrates through the second organic insulating sub-portion.

8. The display panel according to claim 7, wherein the first organic insulating sub-portion comprises a first sub side surface on a side close to the display area;

the second organic insulating sub-portion comprises a second sub side surface on a side close to the display area;

the first etched surface is disposed corresponding to the first sub side surface or the second sub side surface.

9. The display panel according to claim 2, wherein a surface roughness of the top surface between the encapsulation layer and the first wiring hole is greater than a surface roughness of the top surface covered by the encapsulation layer.

10. A display panel comprising a display area, a wiring area, and an effective encapsulation area located between the display area and the wiring area, wherein the display panel comprises:

a substrate;

an inorganic insulating layer disposed on a surface of the substrate;

an organic insulating layer disposed on a surface of the inorganic insulating layer away from the substrate, the organic insulating layer comprising a dam disposed in the effective encapsulation area, an organic insulating portion disposed on a side of the dam away from the display area, a groove disposed between the dam and the organic insulating portion, and a first wiring hole disposed in the wiring area;

a light emitting layer disposed on a surface of the organic insulating layer away from the substrate and correspondingly disposed in the display area;

an encapsulation layer disposed on a surface of the light emitting layer away from the substrate, the encapsulation layer being disposed in the display area and extending to the non-display area, the encapsulation layer covering at least part of the organic insulating portion and not extending to the first wiring hole, a thickness of the encapsulation layer corresponding to the groove being greater than a thickness of the encapsulation layer corresponding to the organic insulating portion.

11. The display panel according to claim 10, wherein the organic insulating portion comprises a first side surface close to the display area side and a top surface away from the substrate, the first side surface being connected to the top surface;

the thickness of the encapsulation layer corresponding to the groove is greater than the thickness of the encapsulation layer corresponding to the top surface.

12. The display panel according to claim 11, wherein the encapsulation layer comprises a first etched surface disposed corresponding to the first side surface, a thickness of a portion of the encapsulation layer located on a side of the first etched surface close to the display area is greater than a thickness of a portion of the encapsulation layer located on a side of the first etched surface away from the display area.

13. The display panel according to claim 12, wherein a first angle between the top surface and the substrate on a side of the top surface away from the display area is smaller than 90 degrees;

a second angle between the first etched surface and the substrate on a side of the first etched surface close to the display area is smaller than 90 degrees.

14. The display panel according to claim 13, wherein the second angle is smaller than or equal to 60 degrees.

15. The display panel according to claim 12, further comprising:

a touch layer disposed on a surface of the encapsulation layer away from the substrate, wherein the touch layer comprises:

an insulating sub-layer disposed on a surface of the encapsulation layer away from the substrate, the insulating sub-layer covering the display area and extending to the non-display area, a boundary of the insulating sub-layer in the non-display area not exceeding the first etched surface;

a touch metal sub-layer disposed on a surface of the insulating sub-layer away from the substrate, the touch metal sub-layer comprising a touch lead wire disposed from the display area to the non-display area, and passing through the first etched surface and extending to the first wiring hole.

16. The display panel according to claim 12, wherein the organic insulating layer comprises:

a first organic insulating sub-layer disposed on a surface of the inorganic insulating layer away from the substrate, the first organic insulating sub-layer comprising a first organic insulating sub-portion disposed in the second groove away from the display area;

a second organic insulating sub-layer disposed on a surface of the first organic insulating sub-layer away from the substrate, the second organic insulating sub-layer comprising a second organic insulating sub-portion disposed in the second groove away from the display area, the second organic insulating sub-portion disposed on a surface of the first organic insulating sub-portion away from the substrate;

wherein the first wiring hole penetrates through the second organic insulating sub-portion.

17. The display panel according to claim 16, wherein the first organic insulating sub-portion comprises a first sub side surface on a side close to the display area;

the second organic insulating sub-portion comprises a second sub side surface on a side close to the display area;

the first etched surface is disposed corresponding to the first sub side surface or the second sub side surface.

18. The display panel according to claim 11, wherein a surface roughness of the top surface between the encapsulation layer and the first wiring hole is greater than a surface roughness of the top surface covered by the encapsulation layer.

19. The display panel according to claim 10, wherein the encapsulation layer covers the groove and directly contacts a surface of the inorganic insulating layer away from the substrate at the groove.

20. A display device comprising a display panel, wherein the display panel comprises a display area, a wiring area, and an effective encapsulation area located between the display area and the wiring area, wherein the display panel comprises:

a substrate;

an inorganic insulating layer disposed on a surface of the substrate;

an organic insulating layer disposed on a surface of the inorganic insulating layer away from the substrate, the organic insulating layer comprising a dam disposed in the effective encapsulation area, an organic insulating portion disposed on a side of the dam away from the display area, a groove disposed between the dam and the organic insulating portion, and a first wiring hole disposed in the wiring area;

a light emitting layer disposed on a surface of the organic insulating layer away from the substrate and correspondingly disposed in the display area;

an encapsulation layer disposed on a surface of the light emitting layer away from the substrate, the encapsulation layer being disposed in the display area and extending to the non-display area, the encapsulation layer covering at least part of the organic insulating portion and not extending to the first wiring hole, a thickness of the encapsulation layer corresponding to the groove being greater than a thickness of the encapsulation layer corresponding to the organic insulating portion.

* * * * *